US006774736B1

(12) United States Patent
Kwek et al.

(10) Patent No.: US 6,774,736 B1
(45) Date of Patent: Aug. 10, 2004

(54) VOLTAGE-CONTROLLED OSCILLATOR CIRCUIT FOR DIRECT MODULATION

(75) Inventors: Ee Hong Kwek, San Diego, CA (US); Jonathon Y. Cheah, San Diego, CA (US)

(73) Assignee: Microtune (San Diego), Inc., San Diego, CA (US)

( * ) Notice: Subject to any disclaimer, the term of this patent is extended or adjusted under 35 U.S.C. 154(b) by 0 days.

(21) Appl. No.: 10/047,332

(22) Filed: Jan. 14, 2002

(51) Int. Cl.$^7$ ................................................. H03B 1/00
(52) U.S. Cl. ............................. 331/177 V; 331/117 R; 331/36 C; 331/179; 331/167
(58) Field of Search ........................... 331/177 V, 36 C, 331/117 R, 167, 179, 117 FE

(56) References Cited

U.S. PATENT DOCUMENTS

| | | | |
|---|---|---|---|
| 3,302,138 A | 1/1967 | Brown et al. | ............ 331/177 V |
| 4,088,968 A | 5/1978 | Pradal et al. | ................. 332/26 |
| 4,736,169 A | * 4/1988 | Weaver et al. | ........... 331/117 R |
| 5,739,730 A | 4/1998 | Rotzoll | .................... 331/177 V |
| 6,268,778 B1 | 7/2001 | Mucke et al. | ............ 331/117 R |
| 6,469,587 B2 | * 10/2002 | Scoggins | ................. 331/117 R |
| 6,483,390 B2 | * 11/2002 | Welland | .................... 331/36 C |

FOREIGN PATENT DOCUMENTS

| | | | |
|---|---|---|---|
| JP | 06350335 | 12/1994 | ............ H03B/5/04 |

OTHER PUBLICATIONS

Parker et al., "A Low–Noise 1.6–GHz CMOS PLL with On–Chip Loop Filter," IEEE, 407–410, 1997.
Samori et al., "Phase Noise Degradation at High Oscillation Amplitudes in LC–Tuned VCO's," IEEE Journal of Solid–State Circuits, vol. 35, No. 1, 96–99, Jan. 2000.
Zannoth et al., "A Single–Chip Bipolar 1.6–GHz VCO with Integrated–Bias Network," IEEE Transactions on Microwave Theory and Techniques, vol. 48, No. 2, 203–205, Feb. 2000.
PCT Report for PCT/US 03/00468, 7 pages, May 9, 2003.

\* cited by examiner

*Primary Examiner*—Arnold Kinkead
(74) *Attorney, Agent, or Firm*—Baker Botts L.L.P.

(57) ABSTRACT

A VCO circuit for a fractional-n PLL circuit is described for implementing a direct modulation scheme. An embodiment of the invention provides a bank of switchable capacitors used to stringently control the gain of the VCO (KVCO). The capacitors provide the stringent control necessary for direct modulation. The bank of switchable capacitors is used to coarsely tune the VCO circuit. A linear capacitor is placed in series with the varactor to linearize the frequency/capacitance response of the varactor. The capacitor also serves to isolate a reference voltage that is used to bias the varactor diode to ensure the linear range of the varactor is within the voltage range of the VCO circuit power supply. The varactor is used for fine tuning of the VCO circuit. For one embodiment the input voltages to the VCO are across a resistance value sufficient to dampen noise picked up through an external loop filter.

26 Claims, 5 Drawing Sheets

VOLTAGE-CONTROLLED OSCILLATOR CIRCUIT FOR DIRECT MODULATION

FIELD OF THE INVENTION

The present invention relates generally to frequency modulation and more particularly to an improved voltage-controlled oscillator circuit (VCO) to effect direct modulation.

BACKGROUND OF THE INVENTION

A phase-locked loop (PLL) circuit is a type of control loop in which both the phase and frequency of a local oscillator is maintained close ("locked") to the phase and frequency of an external reference signal. PLL circuits are implemented in a wide variety of electronic devices including frequency synthesizers for transceivers in radio communication devices. PLL circuits are attractive in modulation applications due to their combination of controllable modulation and stable and adjustable carrier frequency.

FIG. 1 shows a block diagram of a typical PLL circuit in accordance with the prior art. The PLL circuit 100, shown in FIG. 1, includes five basic components: a phase and frequency comparator (phase and frequency detector) 105, a charge pump 106, a loop filter 110, a voltage controlled oscillator (VCO) 115, and a clock divider (frequency divider) 120. The components are connected in a feedback configuration as shown in FIG. 1. The phase detector 105 compares the phase and frequency of the input reference clock signal 102 with the phase and frequency of the feedback VCO signal 108 through the clock divider 120. The charge pump 106 provides a DC output signal 103 proportional to the phase and frequency difference of the two signals. The VCO circuit generates a frequency proportional to its input voltage. The output voltage of the charge pump 106 is used to adjust the VCO 115 until the difference in phase and frequency between the two signals is very small.

The VCO may be used to implement a frequency modulation scheme. For example, a VCO circuit typically used in IQ modulation includes a series of variable capacitors for coarsely tuning the center output frequency and a varactor (voltage controlled capacitor) for finely tuning the center output frequency to the desired frequency. For IQ modulation the VCO circuit is used to set the carrier frequency. Then IQ modulation circuitry is used to modulate the center frequency with a waveform that slightly changes the carrier's frequency. The in-phase (I) portion and the quadrature (Q) portion of the modulating signal contain the transmitted data. For such modulation techniques, in which the VCO only acts to set the center frequency, there is no stringent requirement of linearity for the VCO circuit gain (KVCO). Therefore, the use of a varactor, that produces a linear voltage/frequency characteristic over only a small range, does not present a problem.

In contrast, direct modulation requires a very linear KVCO for greater ranges. For direct modulation, digital data is sent to the PLL, and then based upon this data, a control voltage is generated that includes both the center frequency and the data signal. The control voltage of the VCO is being modulated so modulation depends solely on the linearity of the VCO. With direct modulation the modulating wave shifts a center output frequency between predetermined values, i.e., two different carrier frequencies are used to represent zero and one, respectively. The carrier frequencies, $f_0$ and $f_1$ (representing 0 or 1) are typically shifted in like amount from a center frequency. For example, for a wireless standard having 79 channels in a frequency range of 2402 Mhz–2480 Mhz with each channel separated by 1 Mhz the center frequencies may be equal to 2402 Mhz+nMhz (n=0 to 78). For example, for center frequency $f_c$ equal to 2402 Mhz, $f_0$ equals 2402 Mhz minus some value (e.g., 160 Khz) and $f_1$ equals 2402 Mhz plus a corresponding value. Of course the carrier frequencies are not individual frequencies, but cover a range of frequencies depending on the type of modulation and the signal waveform. Therefore, $f_0$ may range from $f_c$–140 Khz to $f_c$–170 Khz and $f_1$ may be range from $f_c$+140 Khz to $f_c$+170 Khz. For such a modulation scheme a linear KVCO is required over a much larger range compared with other modulation techniques (e.g., IQ modulation).

Another drawback of the prior art VCO (in addition to the small range of KVCO linearity) in terms of implementing direct modulation is that the varactor's voltage-capacitance curve is linear in only a very small region. The bias voltage required for the varactor to operate in the linear range may be outside the voltage range of the VCO power supply.

A further consideration is external noise. Typically, for radio communication applications, the bandwidth of loop filter 110 is very small. A small loop filter bandwidth necessitates large capacitance and resistance values. These are usually too big to be implemented as integrated components and so the loop filter may be implemented externally (i.e., external to the PLL chip). The signal may pick up some noise as it passes from the PLL chip through the bonding wire and PCB and back to the PLL chip.

A VCO that addresses these issues may be significantly better for implementing a direct modulation scheme.

SUMMARY OF THE INVENTION

A voltage-controlled oscillator (VCO) circuit is described for a fractional-n PLL circuit (i.e., having a fractional-n frequency divider). The VCO circuit includes a variable capacitor for coarse tuning and a varactor for fine tuning. The variable capacitor provides a plurality of capacitance values, each capacitance value corresponds to a distinct frequency band. The capacitance values are selected so as to provide a frequency/voltage characteristic for the VCO that is sufficiently linear to implement direct modulation for the frequency band. A capacitor is placed in series with the varactor to linearize the frequency/voltage characteristic of the varactor. The series capacitor value is sufficient to implement direct modulation for a specified channel frequency within the frequency band.

Other features and advantages of the present invention will be apparent from the accompanying drawings, and from the detailed description, that follows below.

BRIEF DESCRIPTION OF THE DRAWINGS

The present invention is illustrated by way of example, and not limitation, by the figures of the accompanying drawings in which like references indicate similar elements and in which.

DETAILED DESCRIPTION

A VCO circuit is described for implementing a direct modulation scheme. An embodiment of the invention provides a bank of switchable capacitors used to stringently control the gain of the VCO (KVCO). The capacitors provide the stringent control necessary for direct modulation. For one embodiment a linear capacitor is used to linearize the frequency/capacitance response of a single varactor. A reference voltage is used to bias the varactor diode to ensure operation within a linear range. For one embodiment the input voltages to the VCO are across a resistance value sufficient to dampen noise picked up through an external loop filter.

It is an intended advantage of one embodiment of the present invention to provide a controlled voltage/frequency response of sufficient linearity to allow implementation of direct modulation. It is another intended advantage of one embodiment of the present invention to provide a linearized capacitance/voltage response of a varactor within a desirable voltage range. It is a further intended advantage of one embodiment of the present invention to reduce the effect of external noise on the VCO output.

In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention.

Figure 1:
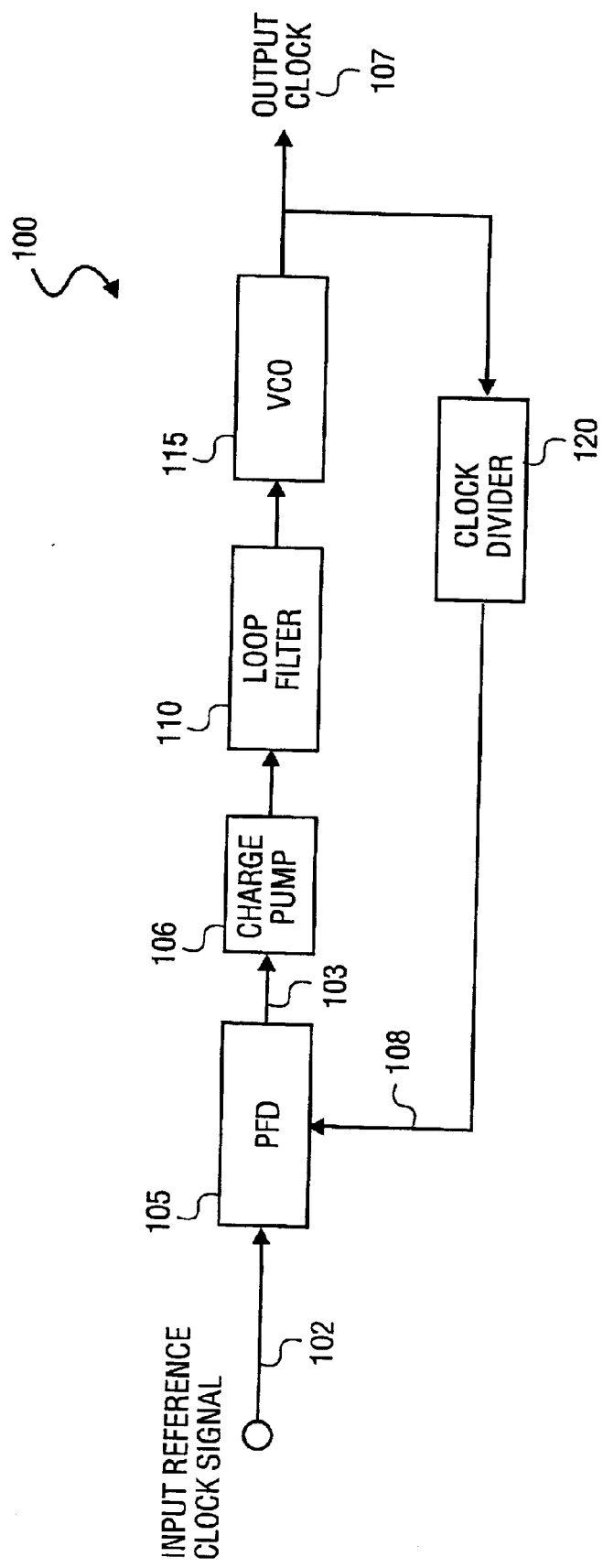
FIG. 1 shows a block diagram of a typical PLL circuit in accordance with the prior art.
Figure 2:
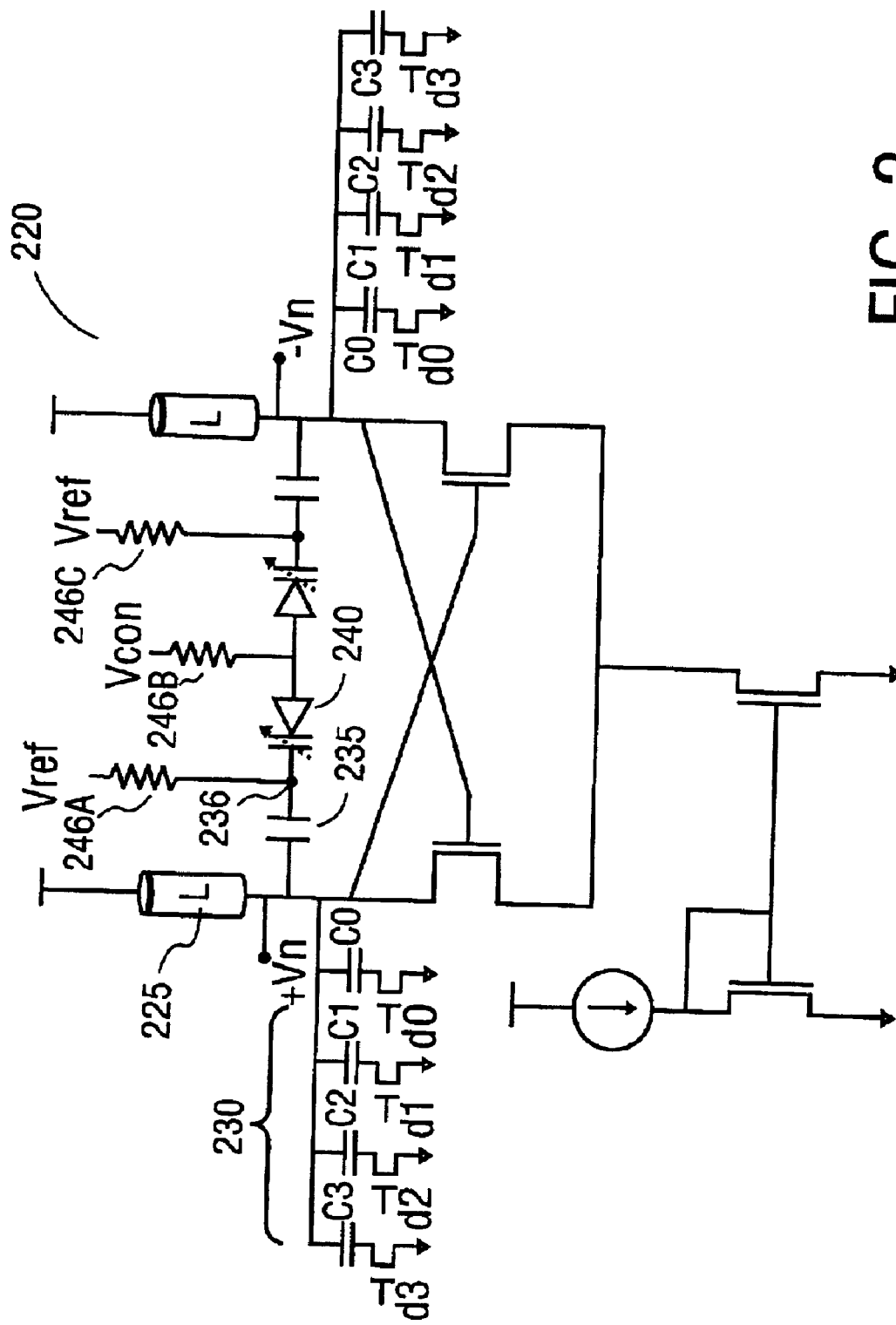
FIG. 2 illustrates a VCO circuit in accordance with one embodiment of the present invention.

FIG. 2 illustrates a VCO circuit in accordance with one embodiment of the present invention. The VCO circuit 220, shown in FIG. 2, includes an inductor 225, a bank of switchable capacitors 230 (e.g., bank of four capacitors $C_0$–$C_3$), a series capacitor 235, and a varactor 240. The frequency of VCO circuit 220 is determined by the inductance and capacitance of the circuit (i.e., the frequency is inversely proportional to square of the product of the inductance and effective capacitance). With the inductor 225 set to a fixed value, the frequency of the VCO circuit may be tuned by adjusting the capacitance. The bank of capacitors 230 may be used to coarsely tune the frequency. For direct modulation it is critical that the frequency voltage characteristic be linear. For one embodiment, the values of each capacitor may be binary weighted. For example $C_1=2C_0$, $C_2=4C_0$, and $C_3=8C_0$. Each capacitor has a binary switch $D_0$–$D_3$ that allows the capacitor to be turned on or off. The four binary switches allow for 16 values of capacitance. The 16 values of capacitance may be chosen to provide a linear response over a much broader range of frequencies than the range of interest. For example, the 16 capacitance values may cover a frequency range of 2200 Mhz to 2700 Mhz for a system utilizing a frequency range of 2402 Mhz to 2480 Mhz. This is done to account for the tolerance values of the passive components. For such a system, three of the 16 capacitance values may cover the frequency range of 2402 Mhz to 2480 Mhz with each covering approximately 27 Mhz.

Figure 3:
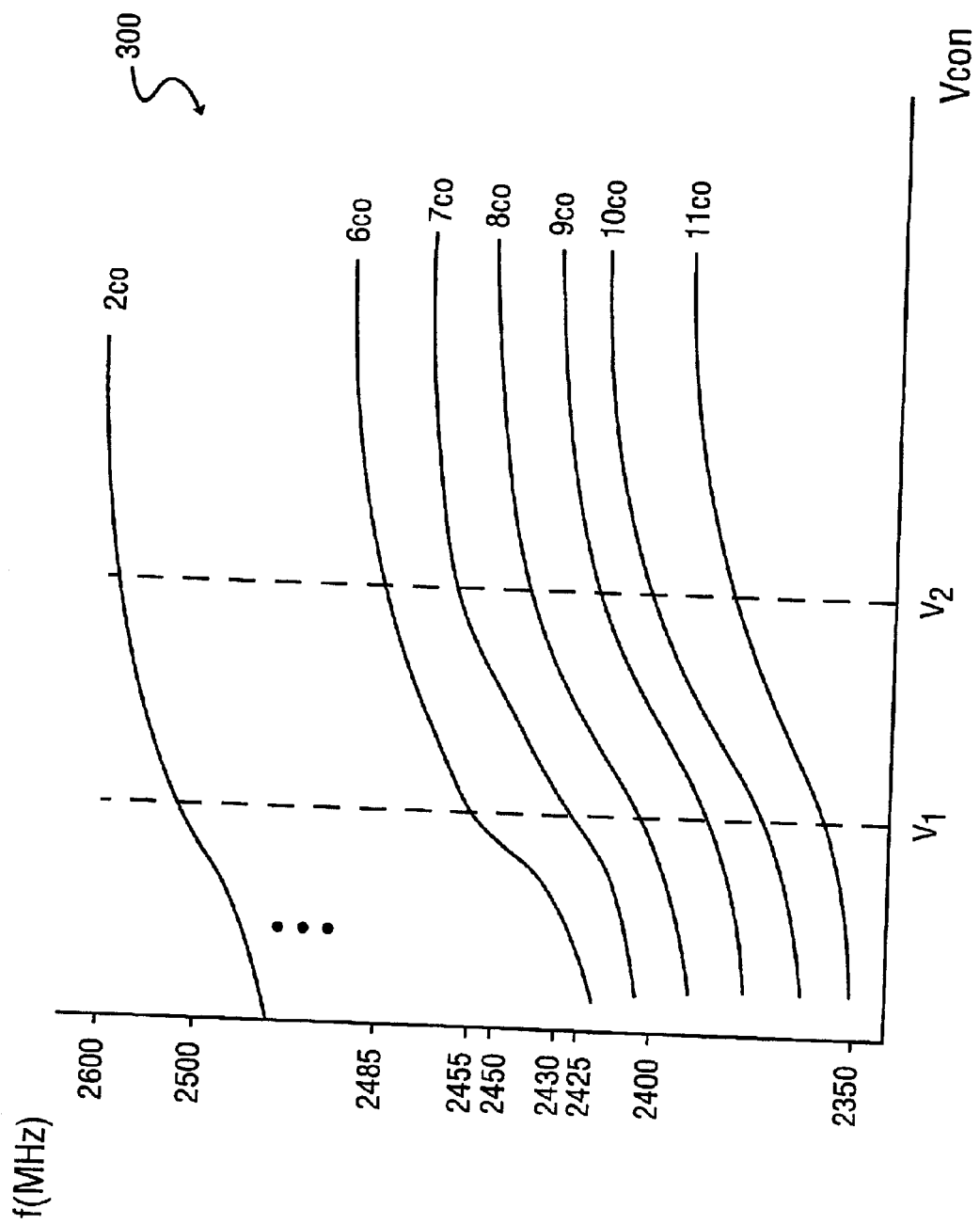
FIG. 3 is a graphical representation of exemplary KVCO values for varying capacitance values.

FIG. 3 is a graphical representation of exemplary KVCO values for varying capacitance values. Graph 300, shown in FIG. 3 illustrates several points about the KVCO graph of a VCO circuit: The KVCO graph is linear for some voltage range (e.g., $V_1$–$V_2$). The corresponding frequency of the linear region depends upon the capacitance value. And capacitance values may be selected so that the linear regions overlap in frequency. For example, the linear region corresponding to a capacitance value of $8C_0$ may cover a frequency range of 2400 Mhz–2430 Mhz while the linear region corresponding to a capacitance value of $7C_0$ may cover a frequency range of 2425 Mhz–2455 Mhz and the linear region corresponding to a capacitance value of $6C_0$ may cover a frequency range of 2450 Mhz–2485 Mhz. Thus, the selected capacitance value determines the frequency band and the bank of capacitors 230 may be used for coarse tuning.

The varactor 240 may be used for fine tuning and also direct modulation. The capacitance of the varactor is determined by the control voltage, $V_{con}$. A change in the control voltage causes a change in the capacitance value of the varactor, which in turn changes the circuit frequency. In typical prior art VCO circuits the small linear range of the varactor is not a problem because the circuit is being tuned to a single desired center frequency. In contrast, for direct modulation a larger linear range is necessary because modulation is done for multiple channels that are near each other (e.g., 1 Mhz spacing between channels).

Figure 4:
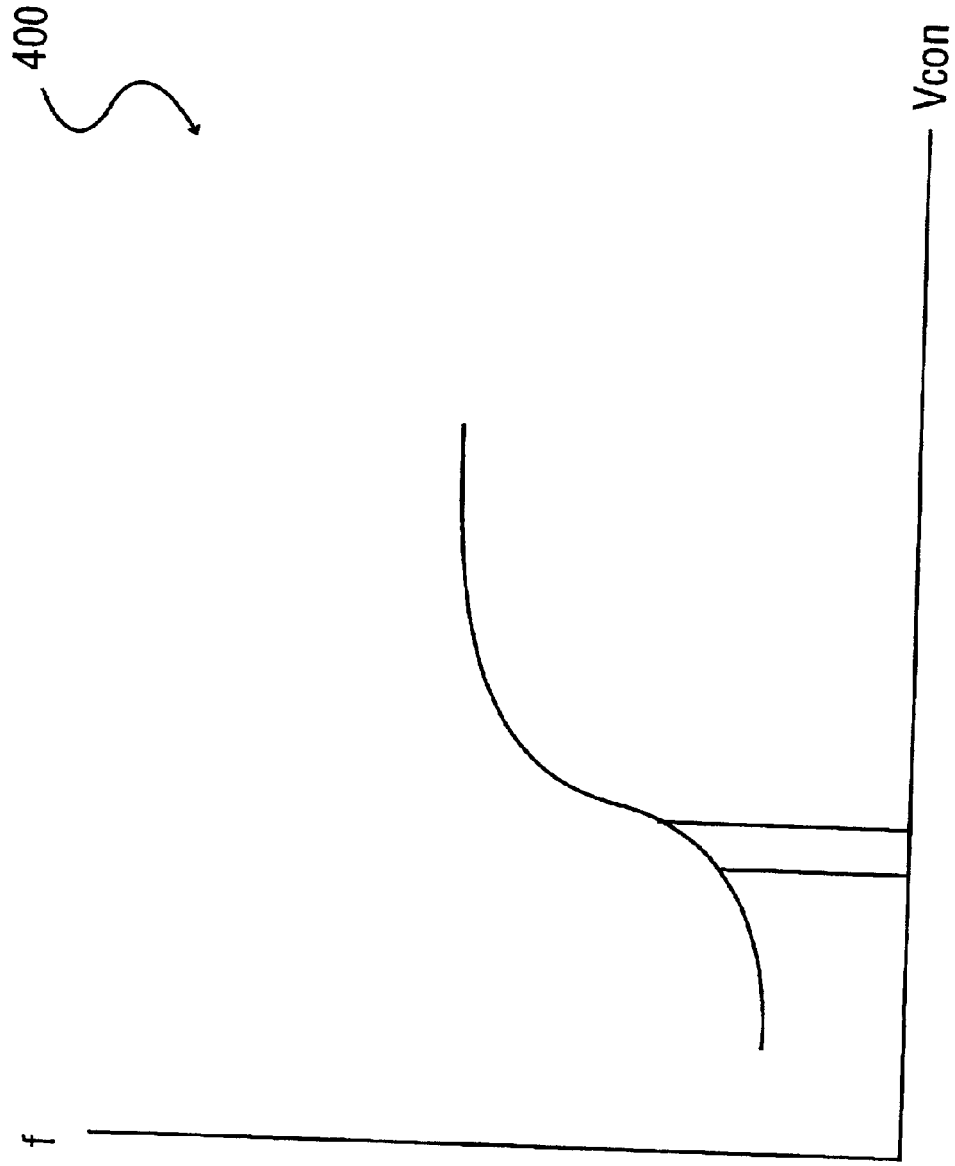
FIG. 4 is a graphical representation of exemplary capacitance/voltage values for a typical varactor.

FIG. 4 is a graphical representation of exemplary frequency/voltage values for a typical varactor. Graph 400, shown in FIG. 4, shows that the frequency/voltage graph of the varactor is linear for only a small region. Also the slope of the linear region is quite high. Series capacitor 235, added to VCO circuit 220 in series with varactor 240, serves to linearize the frequency/voltage graph of the varactor and reduce the slope. The varactor frequency/voltage response is linearized to the extent necessary to implement direct modulation. For one embodiment, series capacitor 235 is a metal-insulator-metal (MIM) type capacitor having a very linear capacitance/frequency characteristic.

Figures 5A, 5B:
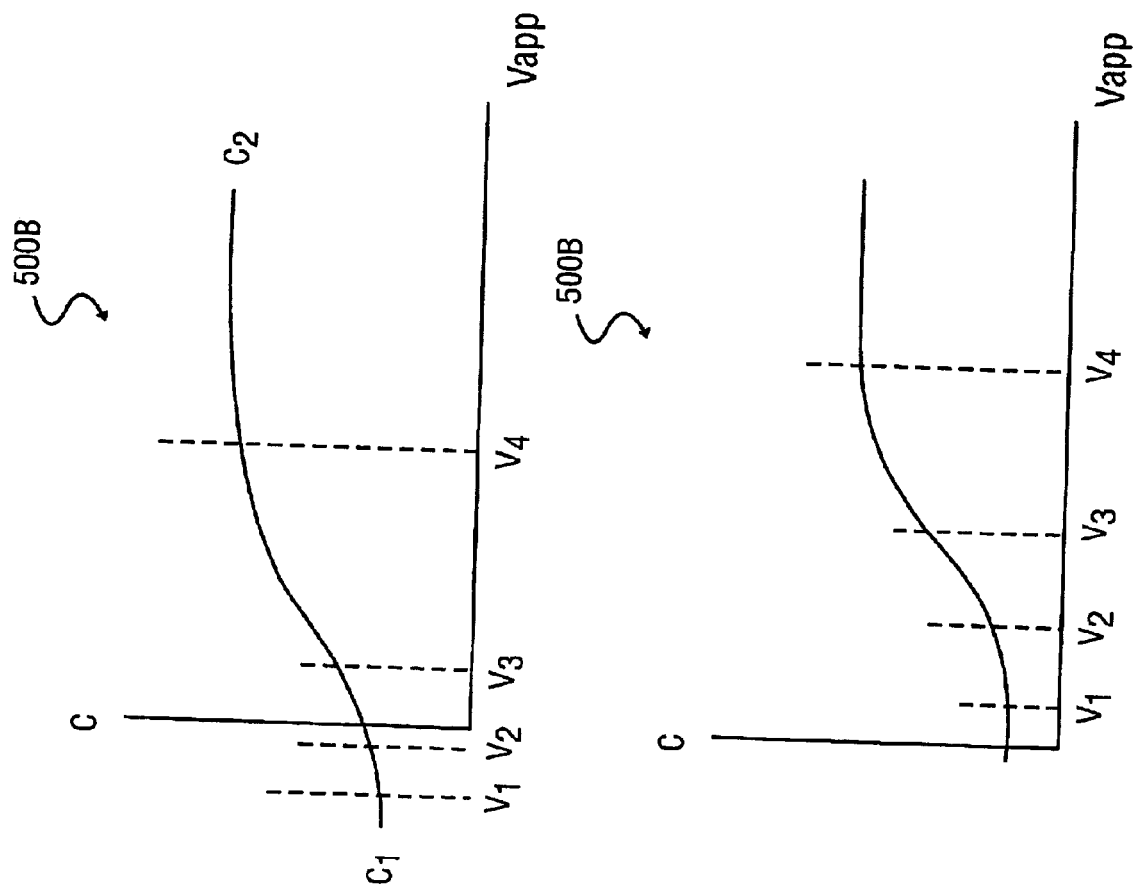
FIG. 5A is a graphical representation of exemplary voltage/capacitance values for a typical varactor in accordance with the prior art.
FIG. 5B is a graphical representation of exemplary voltage/capacitance values for a varactor in accordance with one embodiment of the present invention.

Of course the linearization of the varactor frequency/voltage response reduces the frequency ranged covered by the varactor, but the covered frequency range is increased through use of the variable capacitance of the bank of capacitors 230 as described above. The voltage across the varactor diode must be biased with a certain voltage to obtain a linear response. However the required voltage may be outside the range of the control voltage. FIG. 5A is a graphical representation of exemplary voltage/capacitance values for a typical varactor in accordance with the prior art. Graph 500A, shown in FIG. 5A, shows that the variable capacitance value of the varactor corresponds to an applied voltage between $V_1$–$V_4$. The linear range (i.e., $V_{app}$ between $V_2$–$V_3$) may be a negative voltage that may not be available. The reference voltage, $V_{Ref}$, is a constant value that can be used to set the desired DC bias for the varactor diode to operate in a specified region. FIG. 5B is a graphical representation of exemplary voltage/capacitance values for a varactor in accordance with one embodiment of the present invention. Graph 500B, shown in FIG. 5, shows the linear range ($V_2$–$V_3$) shifted so that the required $V_{app}$ is a more convenient value. Capacitor 235 may be used to isolate the DC voltage of reference voltage, $V_{Ref}$, to node 236. Thus series capacitor 235 serves to linearize the varactor frequency/voltage response and also to allow the varactor diode to be biased at a desired bias point.

As described above the loop filter may be implemented externally necessitating the signal to leave the PLL chip and traverse portions of the PCB. For one embodiment the VCO circuit 220 also contains resistors 246a, 246b, and 246c. These resistors help to dampen any noise that may be picked up as the signal leaves the PLL chip and returns.

In the foregoing specification, the invention has been described with reference to specific exemplary embodiments thereof. It will, however, be evident that various modifications and changes may be made thereto without departing from the broader spirit and scope to the invention as set forth in the appended claims. The specification and drawings are, accordingly, to be regarded in an illustrative sense rather than a restrictive sense.

What is claimed is:

1. A device comprising:
a voltage-controlled oscillator (VCO) circuit, the VCO circuit comprising:
 a) a variable capacitor for coarsely tuning the VCO circuit, the variable capacitor providing one of a plurality of capacitance values, each of the plurality of capacitance values corresponding to a distinct frequency band, each of the plurality of capacitance values providing a frequency/voltage characteristic for the VCO that is sufficiently linear to implement direct modulation for the frequency band, wherein the variable capacitor is a plurality of switchable capacitors, each capacitor coupled to a binary switch that allows the capacitor to be turned on or off;
 b) a varactor for fine tuning the VCO circuit; and
 c) a series capacitor having a capacitance value to linearize a frequency/voltage characteristic of the varactor sufficient to implement direct modulation for a specified channel frequency within the frequency band.

2. The device of claim 1, wherein the plurality of capacitance values comprises sixteen capacitance values, each capacitance value corresponding to one of sixteen frequency bands.

3. The device of claim 2, wherein the sixteen frequency bands cover a frequency range of 2200 Mhz to 2700 Mhz.

4. The device of claim 3, wherein the specified channel frequency is a frequency selected from the group consisting of 2402 Mhz+nMhz, where n is an integer from 0 to 78.

5. The device of claim 1, wherein the VCO circuit is implemented as an integrated circuit.

6. The device of claim 5, wherein the series capacitor is a metal-insulator-metal type capacitor.

7. The device of claim 1 further comprising:
at least one resistor to couple an input voltage to the VCO circuit, the at least one resistor dampening external noise.

8. The device of claim 7, wherein the input voltage comprises a reference voltage and a control voltage.

9. The device of claim 8, wherein the reference voltage is used to bias a diode of the varactor to a desired bias point.

10. The device of claim 9, wherein the series capacitor isolates the reference voltage.

11. A system comprising:
a phase comparator circuit;
a charge pump;
a loop filter circuit;
a fractional-n frequency divider; and
a voltage controlled oscillator (VCO) circuit, the VCO circuit comprising:
 a) a variable capacitor for coarsely tuning the VCO circuit, the variable capacitor providing one of a plurality of capacitance values, each of the plurality of capacitance values corresponding to a distinct frequency band, each of the plurality of capacitance values providing a frequency/voltage characteristic for the VCO that is sufficiently linear to implement direct modulation for the frequency band;
 b) a varactor for fine tuning the VCO circuit;
 c) a series capacitor having a capacitance value to linearize a frequency/voltage characteristic of the varactor sufficient to implement direct modulation for a specified channel frequency within the frequency band; and
 d) at least one resistor to couple an input voltage to the VCO circuit, the at least one resistor dampening external noise, wherein the input voltage comprises a reference voltage and a control voltage.

12. The system of claim 11, wherein the variable capacitor is a plurality of switchable capacitors, each capacitor coupled to a binary switch that allows the capacitor to be turned on or off.

13. The system of claim 12, wherein the plurality of capacitance values comprises sixteen capacitance values, each capacitance value corresponding to one of sixteen frequency bands.

14. The system of claim 13, wherein the sixteen frequency bands cover a frequency range of 2200 Mhz to 2700 Mhz.

15. The system of claim 14, wherein the specified channel frequency is a frequency selected from the group consisting of 2402 Mhz+nMhz, where n is an integer from 0 to 78.

16. The system of claim 11, wherein the VCO circuit is implemented as an integrated circuit.

17. The system of claim 16, wherein the series capacitor is a metal-insulator-metal type capacitor.

18. The system of claim 11, wherein the reference voltage is used to bias a diode of the varactor to a desired bias point.

19. The system of claim 18, wherein the series capacitor isolates the reference voltage.

20. A method for tuning a voltage-controlled oscillator (VCO) circuit, comprising:
coarsely tuning the VCO circuit to implement direct modulation for a frequency band;
finely tuning the VCO circuit using a varactor; and
linearizing a frequency/voltage characteristic of the varactor sufficient to implement direct modulation for a specified channel frequency within the frequency band, wherein linearizing the frequency/voltage characteristic of the varactor is performed by a capacitor arranged in series with the varactor.

21. The method of claim 20, further comprising coupling an input voltage to the VCO, wherein the input voltage comprises a reference voltage and a control voltage.

22. The method of claim 21, further comprising biasing a diode of the varactor to a desired bias point using the reference voltage.

23. The method of claim 20, wherein coarsely tuning comprises providing one of a plurality of capacitance values.

24. The method of claim 23, wherein the plurality of capacitance values are provided by a plurality of switchable capacitors, each capacitor coupled to a binary switch that allows the capacitor to be turned on or off.

25. A device comprising:
a voltage-controlled oscillator (VCO) circuit, the VCO circuit comprising:
 a) a variable capacitor for coarsely tuning the VCO circuit, the variable capacitor providing one of a plurality of capacitance values, each of the plurality of capacitance values corresponding to a distinct frequency band, each of the plurality of capacitance values providing a frequency/voltage characteristic for the VCO that is sufficiently linear to implement direct modulation for the frequency band;
 b) a varactor for fine tuning the VCO circuit;
 c) a series capacitor having a capacitance value to linearize a frequency/voltage characteristic of the varactor sufficient to implement direct modulation for a specified channel frequency within the frequency band; and d) at least one resistor to couple an input voltage to the VCO circuit, the at least one resistor dampening external noise, wherein the input voltage, comprises a reference voltage and a control voltage.

26. A system comprising:

a phase comparator circuit;

a charge pump;

a loop filter circuit;

a fractional-n frequency divider; and a voltage controlled oscillator (VCO) circuit, the VCO circuit comprising:

a) a variable capacitor for coarsely tuning the VCO circuit, the variable capacitor providing one of a plurality of capacitance values, each of the plurality of capacitance values corresponding to a distinct frequency band, each of the plurality of capacitance values providing a frequency/voltage characteristic for the VCO that is sufficiently linear to implement direct modulation for the frequency band, wherein the variable capacitor is a plurality of switchable capacitors, each capacitor coupled to a binary switch that allows the capacitor to be turned on or off;

b) a varactor for fine tuning the VCO circuit; and c) a series capacitor having a capacitance value to linearize a frequency/voltage characteristic of the varactor sufficient to implement direct modulation for a specified channel frequency within the frequency band.

\* \* \* \* \*